(12) United States Patent
Huang

(10) Patent No.: US 10,739,432 B2
(45) Date of Patent: Aug. 11, 2020

(54) DYNAMIC MAGNETIC RESONANCE IMAGING

(71) Applicant: Shanghai Neusoft Medical Technology Co., Ltd., Shanghai (CN)

(72) Inventor: Feng Huang, Shanghai (CN)

(73) Assignee: Shanghai Neusoft Medical Technology Co., Ltd., Shanghai (CN)

( * ) Notice: Subject to any disclaimer, the term of this patent is extended or adjusted under 35 U.S.C. 154(b) by 0 days.

(21) Appl. No.: 16/057,141

(22) Filed: Aug. 7, 2018

(65) Prior Publication Data

US 2019/0041479 A1 Feb. 7, 2019

(30) Foreign Application Priority Data

Aug. 7, 2017 (CN) .......................... 2017 1 0667511

(51) Int. Cl.
*G01R 33/56* (2006.01)
*G01R 33/48* (2006.01)
(Continued)

(52) U.S. Cl.
CPC ..... *G01R 33/5601* (2013.01); *G01R 33/4818* (2013.01); *G01R 33/5608* (2013.01); *G01R 33/5611* (2013.01); *G01R 33/56308* (2013.01)

(58) Field of Classification Search
CPC ............ G01R 33/5601; G01R 33/4818; G01R 33/482–4826; G01R 33/5608;
(Continued)

(56) References Cited

U.S. PATENT DOCUMENTS 6,144,873 A * 11/2000 Madore ................ G01R 33/561
324/309
7,358,730 B2 * 4/2008 Mistretta ............ G01R 33/4824
324/306
(Continued)

OTHER PUBLICATIONS

Pruessmann, K. P. et al., "SENSE: Sensitivity Encoding for Fast MRI," Magnetic Resonance in Medicine, 42:952-962 (1999).
(Continued)

*Primary Examiner* — Patrick Assouad
*Assistant Examiner* — Demetrius R Pretlow
(74) *Attorney, Agent, or Firm* — Fish & Richardson P.C.

(57) ABSTRACT

Dynamic magnetic resonance imaging methods and devices are provided. According to an example, a method includes: collecting respective k-space data for each of imaging phases by scanning a part of a subject via an equidistant undersampling manner, determining basic k-space data for the part of the subject, determining respective differential k-space data for each of the imaging phases based on the respective k-space data for each of the imaging phases and the basic k-space data, obtaining a basic image based on the basic k-space data, determining a respective sparse image for each of the imaging phases, reconstructing a respective differential image for each of the imaging phases from the respective differential k-space data for the imaging phase, and obtaining a respective magnetic resonance image for each of the imaging phases based on the respective differential image for the imaging phase and the basic image.

19 Claims, 7 Drawing Sheets

(51) Int. Cl.
*G01R 33/561* (2006.01)
*G01R 33/563* (2006.01)

(58) Field of Classification Search
CPC ............ G01R 33/5611; G01R 33/5612; G01R 33/56308; G01R 33/5316–56333
See application file for complete search history.

(56) References Cited

U.S. PATENT DOCUMENTS

| | | | | |
|---|---|---|---|---|
| 7,592,808 | B1* | 9/2009 | King | G01R 33/56545 324/307 |
| 8,879,852 | B2* | 11/2014 | Chang | G06T 11/003 382/206 |
| 9,429,636 | B2* | 8/2016 | Ivancevic | G01R 33/5601 |
| 2005/0100202 | A1* | 5/2005 | Huang | G01R 33/5611 382/128 |
| 2008/0197842 | A1* | 8/2008 | Lustig | G01R 33/561 324/307 |
| 2008/0298661 | A1* | 12/2008 | Huang | G01R 33/5611 382/131 |
| 2009/0092303 | A1* | 4/2009 | Griswold | G01R 33/5611 382/131 |
| 2011/0080166 | A1* | 4/2011 | Edelman | G01R 33/5607 324/309 |
| 2013/0089271 | A1* | 4/2013 | Boernert | G01N 24/08 382/274 |
| 2013/0121550 | A1* | 5/2013 | Chang | G06T 11/003 382/130 |
| 2013/0121554 | A1* | 5/2013 | Liu | G06T 11/005 382/131 |
| 2014/0035576 | A1* | 2/2014 | Li | G01R 33/5611 324/309 |
| 2014/0091793 | A1* | 4/2014 | Guo | G01R 33/56341 324/309 |
| 2014/0091798 | A1* | 4/2014 | Arunachalam | G01R 33/4833 324/309 |
| 2014/0303480 | A1* | 10/2014 | Lai | A61B 5/7214 600/410 |
| 2015/0204961 | A1* | 7/2015 | Ivancevic | G01R 33/5601 324/309 |
| 2015/0346303 | A1* | 12/2015 | Hu | G01R 33/5601 600/420 |
| 2017/0035319 | A1* | 2/2017 | Zhao | A61B 5/055 |
| 2017/0139028 | A1* | 5/2017 | Saito | G01R 33/5608 |
| 2018/0360384 | A1* | 12/2018 | Lai | G01R 33/56325 |

OTHER PUBLICATIONS

Huang F. et al., "k-t GRAPPA: A k-space Implementation for Dynamic MRI with High Reduction Factor," Magnetic Resonance in Medicine 54:1172-1184 (2005).

Storey, P. et al., Exploiting Sparsity to Accelerate Noncontrast MR Angiography in the Context of Parallel Imaging; Magnetic Resonance in Medicine 2012; 67:1391-1400.

Griswold, M. A. et al., "Generalized Autocalibrating Partially Parallel Acquisitions (GRAPPA)," Magnetic Resonance in Medicine 47:1202-1210 (2002).

Tsao, J. et al., "Feedback Regularization for Sense Reconstruction," ISMRM annual meeting proceeding, 2002, p. 739.

\* cited by examiner

DYNAMIC MAGNETIC RESONANCE IMAGING

CROSS REFERENCE TO RELATED APPLICATIONS

This application claims priority to Chinese Patent Application No. 201710667511.2, filed on Aug. 7, 2017, the entire content of which is incorporated herein by reference.

BACKGROUND

Due to relatively high soft tissue contrast and spatial resolution, Magnetic Resonance Imaging (MRI) may obtain shape information and function information of an examined part and flexibly select imaging parameters and imaging slices as needed, which has become an important manner of medical imaging technology.

NEUSOFT MEDICAL SYSTEMS CO., LTD. (NMS), founded in 1998 with its world headquarters in China, is a leading supplier of medical equipment, medical IT solutions, and healthcare services. NMS supplies medical equipment with a wide portfolio, including CT, Magnetic Resonance Imaging (MRI), digital X-ray machine, ultrasound, Positron Emission Tomography (PET), Linear Accelerator (LINAC), and biochemistry analyser. Currently, NMS' products are exported to over 60 countries and regions around the globe, serving more than 5,000 renowned customers. NMS's latest successful developments, such as 128 Multi-Slice CT Scanner System, Superconducting MRI, LINAC, and PET products, have led China to become a global high-end medical equipment producer. As an integrated supplier with extensive experience in large medical equipment, NMS has been committed to the study of avoiding secondary potential harm caused by excessive X-ray irradiation to the subject during the CT scanning process.

SUMMARY

The present disclosure provides methods, devices and apparatus for dynamic magnetic resonance imaging.

One aspect of the present disclosure features a dynamic magnetic resonance imaging method, including: collecting respective k-space data for each of a plurality of imaging phases by scanning a part of a subject via an equidistant undersampling manner, where the part of the subject changes dynamically at the plurality of imaging phases; determining basic k-space data for the part of the subject; determining respective differential k-space data for each of the imaging phases based on the respective k-space data for the imaging phase and the basic k-space data; obtaining a basic image by performing image reconstruction on the basic k-space data; determining a respective sparse image for each of the imaging phases; reconstructing a respective differential image for each of the imaging phases from the respective differential k-space data for the imaging phase, where, the reconstruction is regularized according to the respective sparse image for the imaging phase such that the reconstructed respective differential image has same positions of non-zero pixels as the respective sparse image; and obtaining a magnetic resonance image for each of the imaging phases based on the respective differential image for the imaging phase and the basic image.

In some implementations, determining the basic k-space data includes: collecting particular k-space data for a preset imaging phase by scanning the part of the subject via a fullsampling manner; and taking the particular k-space data for the preset imaging phase as the basic k-space data. The preset imaging phase can include one of a first imaging phase before a contrast agent is injected, and a last imaging phase after the contrast agent has been fully washed out.

When scanning via the equidistant undersampling manner, for at least two of the plurality of imaging phases, k-space positions of collected phase encoding lines can be not exactly same.

In some implementations, determining the basic k-space data includes: determining an average of the respective k-space data for the plurality of imaging phases; and taking the average as the basic k-space data.

In some implementations, determining the basic k-space data includes: reconstructing a combined image from the respective k-space data for the plurality of imaging phases by taking the respective k-space data for the plurality of imaging phases as k-space data for one same imaging phase; and performing an inverse Fourier transform on the combined image to determine the basic k-space data.

In some implementations, determining the basic k-space data includes: reconstructing a first image for each of the imaging phases from the respective k-space data for the imaging phase; generating an average image by averaging the first images for the plurality of imaging phases; and performing an inverse Fourier transform on the average image to determine the basic k-space data.

In some implementations, determining the basic k-space data includes: forming virtual entire k-space data by combining the respective k-space data for each of the imaging phases in accordance with a k-space positional relationship of phase encoding lines for each of the imaging phases; and determining the basic k-space data by performing averaging processing on the virtual entire k-space data.

Determining the respective differential k-space data for the imaging phase based on the respective k-space data for the imaging phase and the basic k-space data can include: determining the respective differential k-space data for the imaging phase by subtracting the basic k-space data from the respective k-space data for the imaging phase.

In some implementations, determining the respective sparse image for each of the imaging phases includes: collecting respective central k-space data for each of the imaging phases by scanning the part of the subject via a k-space central region fullsampling manner; obtaining respective central differential k-space data for each of the imaging phases by subtracting central basic k-space data from the respective central k-space data for the imaging phase, where the central basic k-space data refers to one of an average of the respective central k-space data for each of the imaging phases and a part of the basic k-space data located at the k-space central region; and obtaining the respective sparse image for each of the imaging phases by performing image reconstruction on the respective central differential k-space data for the imaging phase.

In some implementations, determining the respective sparse image for each of the imaging phases includes: generating a respective original image for each of the imaging phases by performing image reconstruction on the respective differential k-space data for the imaging phase; and determining the respective sparse image for each of the imaging phases by performing denoising processing on the respective original image for the imaging phase.

Another aspect of the present disclosure features a dynamic magnetic resonance imaging method, including: collecting respective k-space data for each of a plurality of imaging phases by scanning a part of a subject via an equidistant undersampling manner, where the part of the subject changes dynamically at the plurality of imaging phases; determining basic k-space data for the part of the subject; obtaining respective differential k-space data for each of the imaging phases based on the respective k-space data for the imaging phase and the basic k-space data; collecting respective central k-space data for each of the imaging phases by scanning the part of the subject via a k-space central region fullsampling manner; determining respective central differential k-space data for each of the imaging phases based on the respective central k-space data for the imaging phase; training a convolution kernel with the respective central differential k-space data for the imaging phases; fitting uncollected k-space data for each of the imaging phases based on the convolution kernel and the respective differential k-space data for the imaging phase; obtaining fitted entire k-space data for each of the imaging phases by filling fitted uncollected k-space data into the respective differential k-space data for the imaging phase; generating respective entire k-space data for each of the imaging phases by adding the fitted entire k-space data for the imaging phase and the basic k-space data; and generating a respective magnetic resonance image by performing image reconstruction on the respective entire k-space data for the imaging phase.

A further aspect of the present disclosure features a dynamic magnetic resonance imaging device, including: at least one processor and at least one non-transitory machine-readable storage medium coupled to the at least one processor having machine-executable instructions stored thereon that, when executed by the at least one processor, cause the at least one processor to perform operations including: collecting respective k-space data for each of a plurality of imaging phases by scanning a part of a subject via an equidistant undersampling manner, where, the part of the subject changes dynamically at the plurality of imaging phases; determining basic k-space data for the part of the subject; determining respective differential k-space data for each of the imaging phases based on the respective k-space data for the imaging phase and the basic k-space data; obtaining a basic image by performing image reconstruction on the basic k-space data; determining a respective sparse image for each of the imaging phases; reconstructing a respective differential image for each of the imaging phases from the respective differential k-space data for the imaging phase, where, the reconstruction is regularized according to the respective sparse image for the imaging phase such that the reconstructed respective differential image has same positions of non-zero pixels as the respective sparse image; and obtaining a respective magnetic resonance image for each of the imaging phases based on the respective differential image for the imaging phase and the basic image.

In some implementations, determining the basic k-space data includes: collecting particular k-space data for a preset imaging phase by scanning the part of the subject via a fullsampling manner; and taking the particular k-space data for the preset imaging phase as the basic k-space data. The preset imaging phase can include one of a first imaging phase before a contrast agent is injected and a last imaging phase after the contrast agent has been fully washed out.

When scanning via the equidistant undersampling manner, for at least two of the plurality of imaging phases, k-space positions of collected phase encoding lines can be not exactly same.

In some implementations, determining the basic k-space data includes: determining an average of the respective k-space data for the plurality of imaging phases; and taking the average as the basic k-space data.

In some implementations, determining the basic k-space data includes: reconstructing a combined image from the respective k-space data for the plurality of imaging phases by taking the respective k-space data for the plurality of imaging phases as k-space data for one same imaging phase; and performing an inverse Fourier transform on the combined image to determine the basic k-space data.

In some implementations, determining the respective sparse image for each of the imaging phases includes: collecting respective central k-space data for each of the imaging phases by scanning the part of the subject via a k-space central region fullsampling manner; obtaining respective central differential k-space data for each of the imaging phases by subtracting central basic k-space data from the respective central k-space data for the imaging phase, where the central basic k-space data refers to one of an average of the respecitive central k-space data for the imaging phases, and a part of the basic k-space data located at the k-space central region; and obtaining the respective sparse image for each of the imaging phases by performing image reconstruction on the respective central differential k-space data for the imaging phase.

In some implementations, determining the respective sparse image for each of the imaging phases includes: generating a respective original image for each of the imaging phases by performing image reconstruction on the respective differential k-space data for the imaging phase; and determining the respective sparse image for each of the imaging phases by performing denoising processing on the respective original image for the imaging phase.

The details of one or more examples of the subject matter described in the present disclosure are set forth in the accompanying drawings and description below. Other features, aspects, and advantages of the subject matter will become apparent from the description, the drawings, and the claims. Features of the present disclosure are illustrated by way of example and not limited in the following figures, in which like numerals indicate like elements.

DETAILED DESCRIPTION

Figure 1:
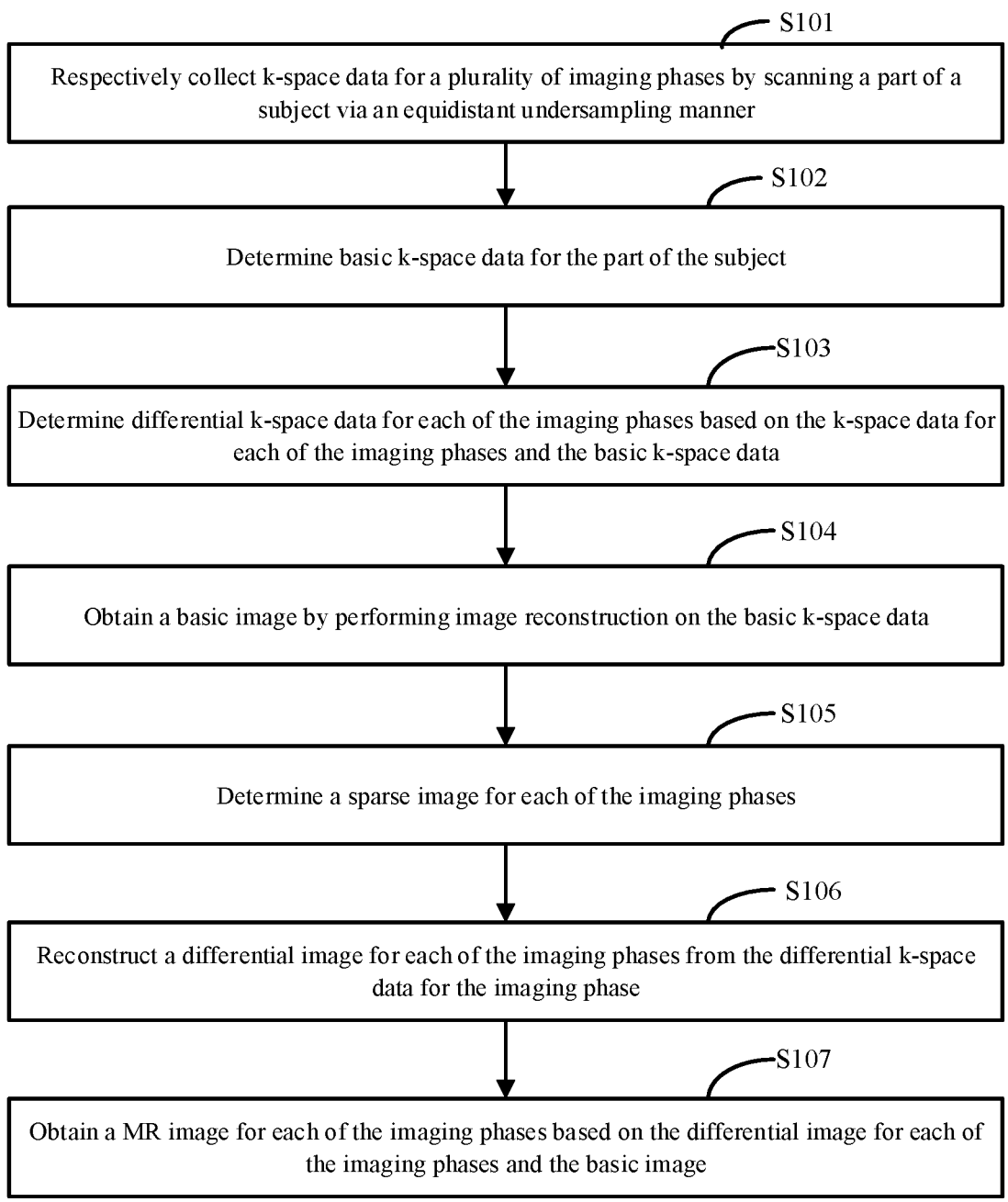
FIG. 1 is a schematic flowchart of a process of a dynamic MRI method according to one or more examples of the present disclosure.

Limited by some factors, such as spatial encoding, the imaging speed of MRI is relatively slow. Due to the relatively slow imaging speed, when dynamic MRI is performed, time resolution of MRI is limited, and at the same time, relatively severe motion artifacts may occur in a reconstructed image, thereby degrading image quality and affecting clinical diagnosis. It limits the application of MRI in the fields of neurological imaging and moving organs such as, heart, coronary artery and so on.

To improve time resolution and spatial resolution of dynamic MRI, magnetic resonance scanning speed is to be increased. The faster the magnetic resonance scanning speed is, the faster the imaging speed of MRI is. In an example, a method of increasing magnetic resonance scanning speed includes a Parallel Imaging method, for example, a plurality of receiving coils having known position and sensitivity are used to determine a spatial position of a magnetic resonance (MR) signal. With the receiving coils having known position and sensitivity, the phase encoding steps can be reduced, thereby shorting scanning time. A method of reducing the phase encoding steps may be called as an undersampling (subsampling) manner. An acceleration multiple of the undersampling manner may be called as an acceleration factor of the scan. But, the prior Parallel Imaging method, such as SENSE (SENSitivity Encoding) method has limited improvement on the scanning speed and can be accelerated twice in clinical at most.

One reason that limits the increment of the scanning speed may include: as the scanning speed is increased, the number of sampling points is reduced, the folding of pixels is increased and a signal to noise ratio (SNR) of a reconstructed image is reduced.

Based on the principle of MRI, if an image obtained by the Parallel Imaging method is sparse, e.g., there are a few non-zero points in pixels of the image, it may be relatively easy to separate folded pixels. In this way, the image can have a relatively good quality. Based on this, the present disclosure provides a dynamic MRI method. In the dynamic MRI method, non-sparse MR signal data is transformed into sparse images.

When a part of a subject (where, the part of the subject changes dynamically) is scanned by the dynamic MRI method, during a relatively short time period, the part of the subject is scanned n times in a way that n number of MR images is obtained. The n number of MR images corresponds to n number of imaging phases. The difference between then number of MR images is little. In dynamic MRI, such as dynamic contrast enhanced (DCE) MRI or non-contrast enhanced MR angiography (Non-CE MRA), tissue structure information of images for the n imaging phases is basically same, only part information of images is different (that is, there is difference between the images). In theory, the difference in image domain is sparse. To further increase the MR scanning speed in a case that the quality of a reconstructed image is ensured, the dynamic MRI method provided by the disclosure uses a feature that the difference between the n number of MR images is little. In the dynamic MRI method, a basic image is obtained by performing image reconstruction on basic k-space data, and then an MR image for each of the imaging phases is obtained by combining a differential image for each of the imaging phases with the basic image.

In an example, when reconstructing the differential image for each of the imaging phases with the differential k-space data for each of the imaging phases, by regularizing the reconstruction according to the sparse image for each of the imaging phases, i.e., taking positions of non-zero pixels in the sparse image as prior knowledge to regularize the reconstruction, the reconstructed differential image has the same non-zero pixels as the sparse image. When the image reconstruction is performed under the constraint of image sparsity, the reconstructed MR image has a relatively high signal-to-noise ratio. That is, in a case that the acceleration factor of the MR scanning speed is relatively high, the reconstructed MR image can have relatively good quality with the dynamic MRI method provided by the present disclosure. Therefore, the dynamic MRI method provided by the present disclosure can further increase the MR scanning speed in a case that the quality of a reconstructed image is ensured.

It is noted that the dynamic MRI method provided by the present disclosure can be applied to dynamic MRI of moving organs, such as cardiac function detection, or applied to dynamic enhanced imaging, such as arterial angiography which is injected a contrast agent.

Before describing the detailed description of the present disclosure, technical terms used to describe the detailed description of the present disclosure are first introduced.

Since when the dynamic MRI method is applied, k-space data for each of the imaging phases is similar, k-space data for each of the imaging phases is divided into basic k-space data and differential k-space data. The basic k-space data for each of the imaging phases refers to approximately same k-space data for each of the imaging phases. To reconstruct relatively accurate MR images for a moving organ, when the method provided by the present disclosure is applied to different application scenarios, the method of determining the basic k-space data for each imaging phase is also different.

The differential k-space data for each of the imaging phases refers to different k-space data between each of the imaging phases. In an example, the differential k-space data for the imaging phase is obtained by subtracting the basic k-space data from the k-space data for the imaging phase.

The detailed description of the present application is described in detail below with reference to the accompanying drawings.

FIG. 1 is a schematic flowchart of a process of a dynamic MRI method according to one or more examples of the present disclosure. As shown in FIG. 1, the process of the dynamic MRI method includes steps S101-S107.

At step S101, respective k-space data for each of a plurality of imaging phases is collected by scanning a part of a subject via an equidistant undersampling manner, where, the part of the subject changes dynamically at the plurality of imaging phases.

At step S102, basic k-space data for the part of the subject is determined.

At step S103, differential k-space data for each of the imaging phases is determined based on the k-space data for each of the imaging phases and the basic k-space data.

In an example, the differential k-space data for each of the imaging phases is obtained by subtracting the basic k-space data obtained by step S102 from the k-space data for the imaging phase obtained by step S101.

At step S104, a basic image is obtained by performing image reconstruction on the basic k-space data.

In an example, the step S104 is implemented by a Parallel Imaging method, such as the SENSE manner.

At step S105, a sparse image for each of the imaging phases is determined.

At step S106, a differential image for each of the imaging phases is reconstructed from the differential k-space data for the imaging phase by regularizing the reconstruction according to the sparse image for the imaging phase such that the reconstructed differential image for the imaging phase has the same positions of non-zero pixels in the sparse image for the imaging phase.

At step S107, an MR image for each of the imaging phases is obtained based on the differential image for each of the imaging phases and the basic image.

In an example, the MR image for each of the imaging phases is respectively obtained by adding the differential image for the imaging phase and the basic image.

In the dynamic MRI method provided by examples of the present disclosure, it uses the similarity between MR images for the imaging phases, and the sparsity of the sparse image for each of the imaging phases. When reconstructing the differential image for each of the imaging phases from the differential k-space data for each of the imaging phases, positions of non-zero pixels in the sparse image for each of the imaging phases are taken as prior knowledge to regularize the image reconstruction such that the reconstructed differential image has the same positions of non-zero pixels as the sparse image. When the image reconstruction is performed under the constraint of image sparsity, the reconstructed image has a relatively high signal-to-noise ratio. That is, in a case that the acceleration factor of the MR scanning speed is relatively high, the reconstructed MR image can have relatively good quality with the dynamic MRI method provided by the present disclosure. Therefore, the dynamic MRI method provided by the present disclosure can further increase the MR scanning speed in a case that the quality of a reconstructed image is ensured.

In the present disclosure, the collected data includes the following three categories.

First, according to preset magnetic resonance scanning parameters, k-space data for each of the imaging phases (hereinafter, may also be referred to as first data for each of the imaging phases) is respectively collected by scanning the part of the subject via the equidistant undersampling manner. In an example, L number of receiving coils (i.e., L number of channels) is provided for collecting data and the number of imaging phases is T. At this case, L*T sets of first data are collected. L is an integer greater than or equal to 2. T is an integer greater than or equal to 2. In the undersampling manner, some phase encoding lines (hereinafter, may also be referred to as lines) are missing in the k-space. That is, the missing lines are not scanned and thus there is no data collected for the missing lines. The undersampling manner includes an equidistant undersampling manner and a non-equidistant undersampling manner. In the equidistant undersampling manner, for one channel for image phase, the distance between each adjacent two collected lines is equal. Examples provided by the present disclosure are described in detail by taking the equidistant undersampling manner as an example.

The k-space refers to a magnetic resonance signal space (a raw data space) that reflects characteristics of magnetic resonance signals in a frequency domain. Raw signal data obtained by magnetic resonance scanning is stored in the k-space, and a magnetic resonance image may be obtained by transforming (e.g., by Fourier transform) the data in the k-space. A principle of MRI spatial encoding specifies that each row of the k-space has a dedicated phase encoding. If the rows near the central region of the k-space are determined, the corresponding phase encoding lines can be determined. Then corresponding magnetic resonance scanning parameters can be set to achieve collection of magnetic resonance data corresponding to a central region of the k-space.

Second, according to preset magnetic resonance scanning parameters, k-space data for a preset imaging phase (hereinafter, may also be referred to as second data) is collected by scanning the part of the subject via the fullsampling manner. In an example, when L number of receiving coils is provided for collecting data, L sets of second data are collected because the preset imaging phase is one of the imaging phases. In the fullsampling manner, all the phase encoding lines in the k-space are scanned.

The preset imaging phase can be any one of the imaging phases. In an example, to improve the accuracy of imaging, when the dynamic MRI method provided by the disclosure is applied in dynamic enhanced imaging, such as arterial angiography injected a contrast agent, the preset imaging phase refers to either a first imaging phase which is acquired before the contrast agent is injected, or a last imaging phase which is acquired after the contrast agent has been fully washed out.

Third, according to preset magnetic resonance scanning parameters, central k-space data for each of the imaging phases (hereinafter, may also be referred to as third data for each of the imaging phases) is respectively collected by scanning the part of the subject via a k-space central region fullsampling manner. The k-space central region fullsampling manner refers to fullsampling for a k-space central region. The k-space central region may be referred to as an Auto Calibrate Signal (ACS) region, which is a region near the center of a k-space.

In an example, L number of receiving coils is provided for collecting data and the number of imaging phases is T. At this case, L*T sets of third data are collected.

In an example, only first data is collected. In another example, first data and third data are collected. In still another example, first data, second data and third data are collected.

In an example, the equidistant undersampling manner to collect first data may include an interleaved partial acquisition manner used in k-t GeneRalized Autocalibrating Partially Parallel Acquisitions (k-t GRAPPA). In the interleaved partial acquisition manner, for at least two imaging phases, k-space positions of collected phase encoding lines (hereinafter, may also be referred to as lines) are not exactly same. The interleaved partial acquisition manner may be applied in a case that a number of imaging phases are relatively more.

For example, it is assumed that the acceleration factor is A, for each imaging phase, positions of collected lines in a k-space are expressed by (A*n+i). Where, A is an integer greater than or equal to 2, n is an integer, 1 i is an integer, (A*n+i) is not greater than a number of lines in the k-space and the value of i in (A*n+i) for at least two imaging phases is different. In this way, collected lines for the plurality of imaging phases can cover the k-space.

In another example, the equidistant undersampling manner to collect first data may include an equidistant undersampling manner used in the SENSE manner. In the equidistant undersampling manner used in the SENSE manner, for each imaging phase, k-space positions of collected lines are same. For example, it is assumed that the acceleration factor is A, for each imaging phase, positions of collected lines in a k-space are expressed by (A*n+i). Where, A is an integer greater than or equal to 2, n is an integer, 1≤i≤A, is an integer, (A*n+i) is not greater than a number of lines in the k-space and the value of i in (A*n+i) for each imaging phase is same.

Examples of step S102 is described in detail below.

In an example, step S102 includes taking the second data as the basic k-space data for the part of the subject.

In another example, the basic k-space data is determined based on the first data for each of the imaging phases.

Figure 2:
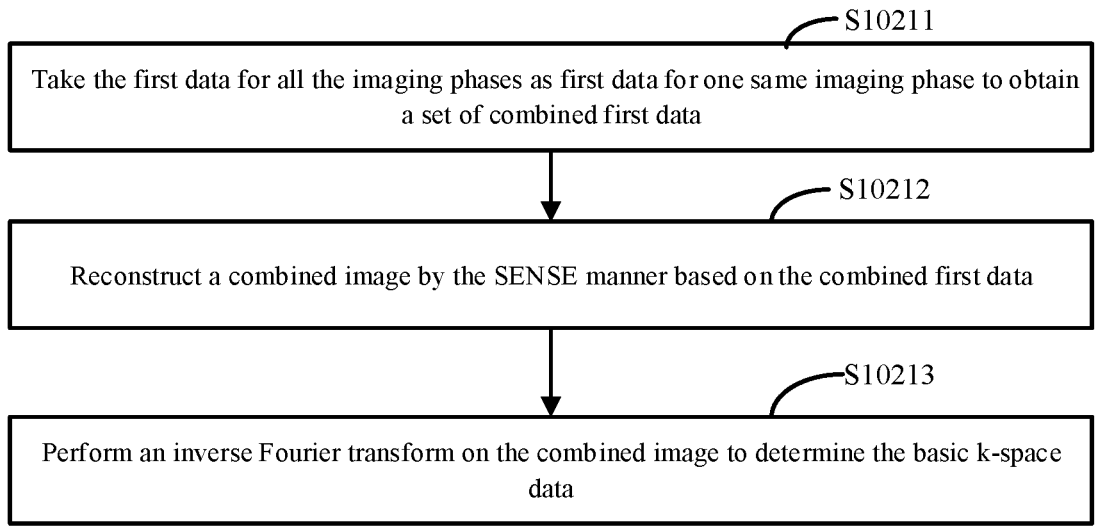
FIG. 2 is a schematic flowchart of a process of a method of determining the basic k-space data based on the first data for each of the imaging phases according to one or more examples of the present disclosure.

FIG. 2 is a schematic flowchart of a process of a method of determining the basic k-space data based on the first data for each of the imaging phases according to one or more examples of the present disclosure. The process includes steps S10211-S10213.

At step S10211, the first data for all the imaging phases is taken as first data for one same imaging phase to obtain a set of combined first data.

At step S10212, a combined image is reconstructed by the SENSE manner based on the combined first data. It is noted that the first data for each of the imaging phases is combined by the SENSE manner to reconstruct the combined image, and the combined image is taken as the basic image. In this way, noise of the basic image can be reduced, thereby improving the quality of the basic image.

At step S10213, an inverse Fourier transform is performed on the combined image to determine the basic k-space data.

It is known that a Fourier transform is performed on k-space data to obtain an MR image and an inverse Fourier transform is performed on the MR image to obtain the corresponding k-space data.

Figure 3:
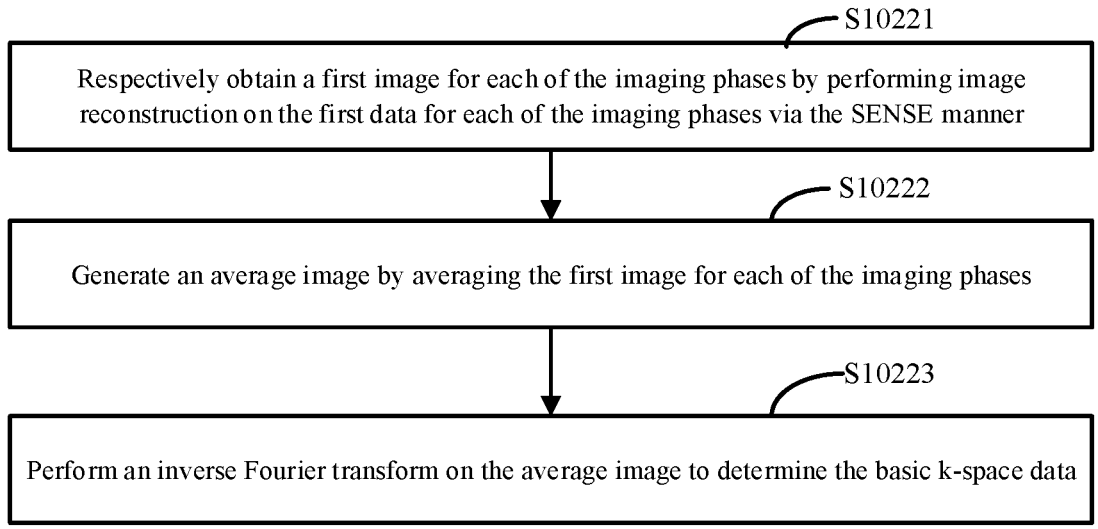
FIG. 3 is a schematic flowchart of a process of a method of determining the basic k-space data based on the first data for each of the imaging phases according to one or more examples of the present disclosure.

FIG. 3 is a schematic flowchart of a process of a method of determining the basic k-space data based on the first data for each of the imaging phases according to one or more examples of the present disclosure. The process includes steps S10221-S10223.

At step S10221, a first image for each of the imaging phases is respectively obtained by performing image reconstruction on the first data for each of the imaging phases via the SENSE manner.

At step S10222, an average image is generated by averaging the first images for the imaging phases.

At step S10223, an inverse Fourier transform is performed on the average image to determine the basic k-space data.

Figure 4:
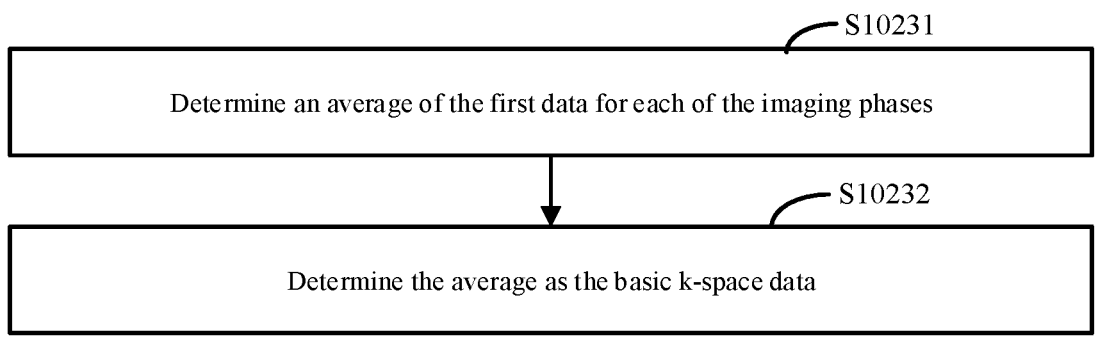
FIG. 4 is a schematic flowchart of a process of a method of determining the basic k-space data based on the first data for each of the imaging phases according to one or more examples of the present disclosure.

FIG. 4 is a schematic flowchart of a process of a method of determining the basic k-space data based on the first data for each of the imaging phases according to one or more examples of the present disclosure. The process includes steps S10231-S10232.

At step S10231, an average of the first data for each of the imaging phases is determined.

At step S10232, the average is determined as the basic k-space data.

Figure 5:
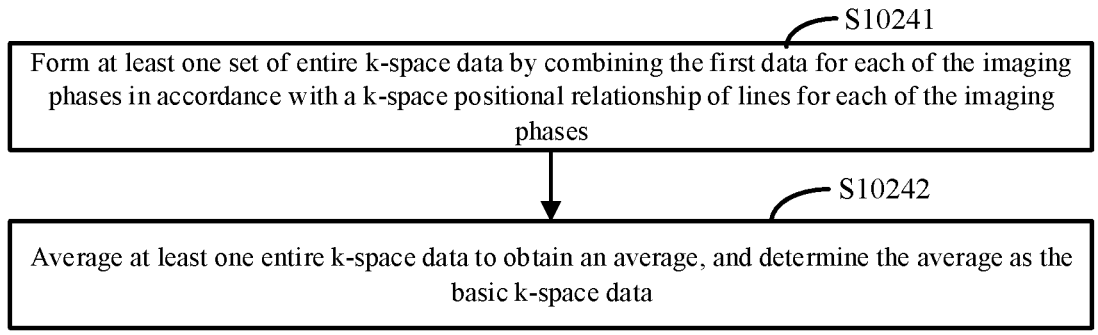
FIG. 5 is a schematic flowchart of a method of determining the basic k-space data based on the first data for each of the imaging phases according to one or more examples of the present disclosure.

FIG. 5 is a schematic flowchart of a process of a method of determining the basic k-space data based on the first data for each of the imaging phases according to one or more examples of the present disclosure. The process includes steps S10241-S10242.

At step S10241, at least one set of entire k-space data (may also be referred to as virtual entire k-space data) is formed by combining the first data for each of the imaging phases in accordance with a k-space positional relationship of lines for each of the imaging phases.

At step S10242, the at least one set of entire k-space data is averaged to obtain an average, and the average is determined as the basic k-space data. In general, the number of imaging phases is relatively more than one, and in this case, two or more sets of entire k-space data are obtained. In some cases, if only one set of entire k-space data is formed at step S10241, the average is the set of entire k-space data.

The method of determining the basic k-space data based on the first data for each of the imaging phases as shown in FIG. 5 is applied to a case that the first data for each of the imaging phases is collected by the interleaved partial acquisition manner used in k-t GRAPPA.

The methods of determining the basic k-space data are applied to different MRI application scenarios.

In an example, when the dynamic MRI method provided by the present disclosure is applied to dynamic enhanced imaging, such as arterial angiography which is injected a contrast agent, since a user is more concerned with the morphology of the arterial blood vessel after the contrast agent is injected, MRI of the arterial blood vessel after the contrast agent is injected needs a relative high time resolution and spatial resolution, but the time resolution and the spatial resolution before the contrast agent is injected and after the contrast agent has been fully washed out is relatively low. In this case, the basic k-space data may be defined as an entire k-space data for a preset imaging phase obtained by the fullsampling manner, i.e., the second data. Where, the preset imaging phase refers to either a first imaging phase which is acquired before the contrast agent is injected, or a last imaging phase which is acquired after the contrast agent has been fully washed out.

In another example, when the dynamic MRI method provided by the present disclosure is applied to dynamic MRI of a moving organ, since the contribution of an image for each imaging phase to the dynamic MRI is substantially same, in this case, the basic k-space data may be determined based on any method shown in FIGS. 2-5. For example, when dynamic MRI is performed on the heart of the subject, a MR image of the thoracic cavity for each imaging phase is substantially same and the difference includes a heartbeat diagram caused by the heartbeat. In this example, an average of the first data of the thoracic cavity for each imaging phase is taken as basic k-space data.

Examples of step S105 is described in detail below.

Figure 6:
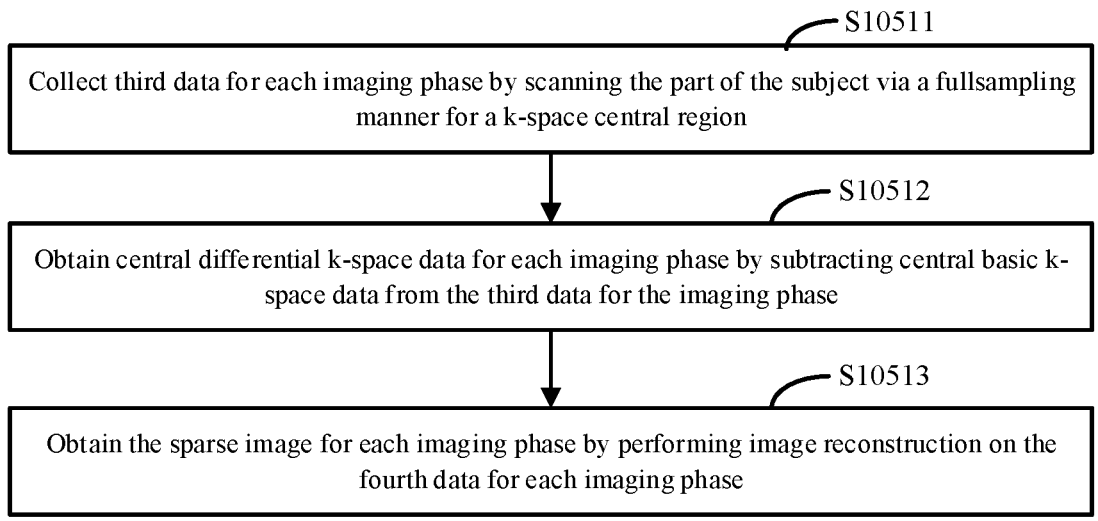
FIG. 6 is a schematic flowchart of step S105 according to one or more examples.

FIG. 6 is a schematic flowchart of step S105 according to one or more examples. As shown in FIG. 6, the step S105 includes steps S10511-S10513.

At step S10511, according to preset MR scanning parameters, third data for each imaging phase is collected by scanning the part of the subject via a fullsampling manner for a k-space central region, where the k-space central region refers to a region near a center of a k-space.

At step S10512, central differential k-space data for each imaging phase (hereinafter, may also be referred to as fourth data for each imaging phase) is obtained by subtracting central basic k-space data from the third data for the imaging phase, where the central basic k-space data refers to an average of the third data for each imaging phase or a part of the second data located at the k-space central region.

It is noted that when the basic k-space data is defined as an average of the first data for each imaging phase, the central basic k-space data refers to an average of the third data for each imaging phase; and when the basic k-space data is defined as the second data, the central basic k-space data refers to the part of the second data located at the k-space central region.

At step S10513, the sparse image for each imaging phase is obtained by performing image reconstruction on the fourth data for each imaging phase.

Figure 7:
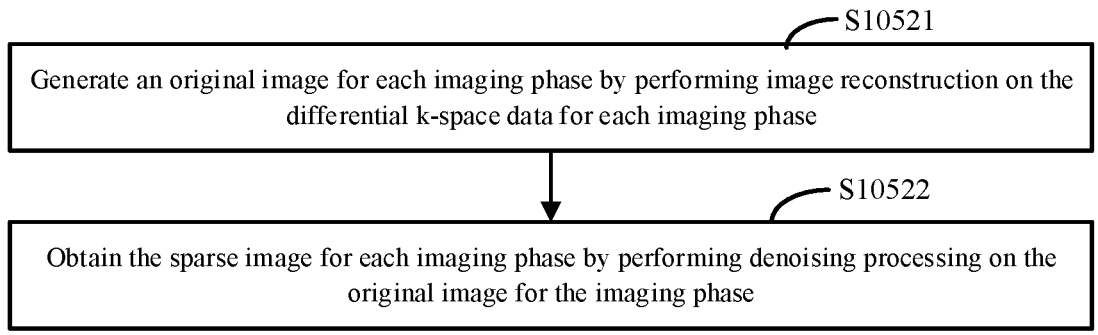
FIG. 7 is a schematic flowchart of step S105 according to one or more examples.

FIG. 7 is a schematic flowchart of step S105 according to one or more examples. As shown in FIG. 7, the step S105 includes steps S10521-S10522.

At step S10521, an original image for each imaging phase is generated by performing image reconstruction on the differential k-space data for each imaging phase.

At step S10522, the sparse image for each imaging phase is obtained by performing denoising processing on the original image for the imaging phase.

In an example, a low-pass filter is used to filter out high-frequency information in the original image for each imaging phase to obtain a low-frequency information image for each imaging phase, and the low-frequency information image for each imaging phase is taken as the sparse image for each imaging phase.

In another example, other denoising methods in the image domain, such as, Total Variation, wavelet and so on, may be used to perform denoising processing on the original image for each imaging phase, so as to obtain the sparse image for each imaging phase.

It is understood that the differential k-space data for each imaging phase can be denoised first, and then image reconstruction is performed on the denoised differential k-space data for each imaging phase to the sparse image for each imaging phase.

Examples of step S106 is described in detail below.

In an example, the regularization relates to a data fidelity item (such as, $$\sum_{j=1}^{Nch} \|F_p(S_j I) - k_j\|_2^2$$

in the following formula (S106-1)) and a regularization item (such as, $\alpha\|I-\hat{I}81_2\|^2$ in the following formula (S106-1)). For example, L2 norm of the sparse image obtained by step S105 can be taken as the regularization item. If a point at which a pixel in a prior knowledge image (such as, the sparse image obtained by step S105) is close to 0, to make the point at which the pixel in the differential image is also close to 0, a reciprocal of the pixel in the prior knowledge image may be used as the weight of the regularization item. In this way, the weight of the regularization item at which the pixel in the prior knowledge image is close to 0 is relatively large, such that the corresponding L2 norm is relatively small and if a point at which a pixel in the prior knowledge image is close to 0, the point at which the pixel in the differential image is also close to 0.

In an example, the regularization is expressed by formula (S106-1):

$$\min_I E\left|\hat{I} = \sum_{j=1}^{Nch} \|F_p(S_j I) - k_j\|_2^2 + \alpha\|I - \hat{I}\|_2^2\right.$$  (S106-1)

In formula (S106-1), I represents a differential image for an imaging phase, represents a prior knowledge image, such a sparse image obtained by step S105, α represents a weight of the regularization item, $k_j$ represents differential k-space data for the imaging phase in a j-th receiving coil, $S_j$ represents coil sensitivity of the j-th receiving coil, $F_p$ represents an operator including Fourier transform and undersampling trajectory operation, Nch represents the number of receiving coils, E represents an indicator of a functional formula which takes I as a variable and is located at the right side of the equality sign in the formula (S106-1).

The above is examples of the dynamic MRI method provided by the present disclosure.

The following describes the dynamic MRI method provided by the present disclosure by taking T number of imaging phases and L number of receiving coils (channels) corresponding to each imaging phase as an example. Where, T≥2, L≥2, and T and L both are integers.

Figure 8:
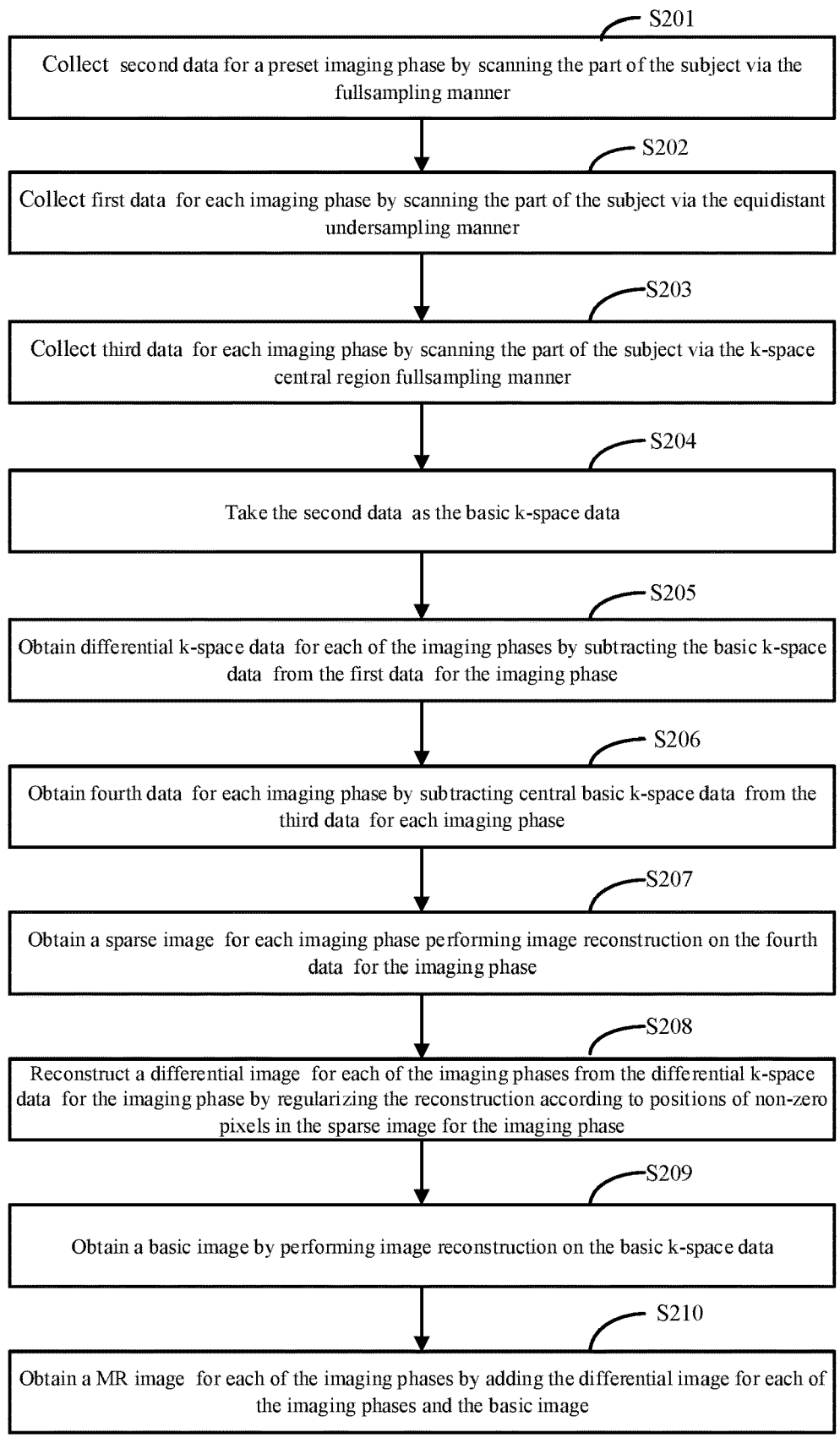
FIG. 8 is a schematic flowchart of a process of a dynamic MRI method according to one or more examples of the present disclosure.

FIG. 8 is a schematic flowchart of a process of a dynamic MRI method according to one or more examples of the present disclosure. The process of the method shown in FIG. 8 includes steps S201-S210.

At step S201, according to preset magnetic resonance scanning parameters, second data $K_l^o$ for a preset imaging phase is collected by scanning the part of the subject via the fullsampling manner, where l∈{1, 2, . . . , L}. There are L sets of second data.

The preset imaging phase can be any one of the imaging phases. In an example, to improve the accuracy of imaging, when the dynamic MRI method provided by the disclosure is applied in dynamic enhanced imaging, such as arterial angiography of perfusion drugs or Non-CE MRA, the preset imaging phase refers to a first imaging phase which is acquired before a contrast agent is injected or a last imaging phase which is acquired after the contrast agent has been fully washed out.

In an example, the preset magnetic resonance scanning parameters include repetition time, number of slices to be scanned, echo time, slice thickness, inversion time, slice spacing, sampling bandwidth, flip angle, number of excitations, echo train length and so on.

At step S202, according to preset magnetic resonance scanning parameters, first data $k_i^t$ for each imaging phase is collected by scanning the part of the subject via the equidistant undersampling manner.

To shorten the scanning time and increase the scanning speed, the first data $K_i^t$ for each imaging phase is collected via the equidistant undersampling manner, where, i∈{1, 2, . . . , T} and l∈{1,2, . . . , L}.

Since for one imaging phase, the first data for each channel is collected, L sets of first data are obtained. At step S202, L*T sets of first data $K_i^t$ are obtained.

At step S203, according to preset magnetic resonance scanning parameters, third data $K'_l^t$ for each imaging phase is collected by scanning the part of the subject via the k-space central region fullsampling manner.

To reconstruct the sparse image for each imaging phase more accurately, at step S203, the third data $K'_l^t$ for each imaging phase for each channel is collected. At step S203, L*T sets of third data $K'_l^t$ are obtained.

It is noted that, at the above steps S201-S203, since in the different sampling manners, partial MR scanning parameters associated with the sampling manner are different, except for the partial MR scanning parameters, other MR scanning parameters applied in the above steps S201-S203 are the same.

At step S204, the second data $K_l^o$ is taken as the basic k-space data.

At step S205, differential k-space data $rK_i^t$ for each of the imaging phases is obtained by subtracting the basic k-space data $K_i^o$ from the first data $K_i^t$ for the imaging phase.

To reconstruct a unique image for each of the imaging phases, the differential k-space data for each of the imaging phases needs to be obtained.

Since the first data $K_i^t$ for each of the imaging phases includes the basic k-space data $K_i^o$ and the differential k-space data $rK_i^t$ for the imaging phase, the differential k-space data $rK_i^t$ for each of the imaging phases can be obtained by subtracting the basic k-space data $K_i^o$ from the first data $K_i^t$ for the imaging phase. At step S205, L*T sets of differential k-space data $rK_i^t$ are obtained.

The step S205 may be expressed by formula (1):

$$rK_i^t = K_i^t - K_i^o \qquad (1).$$

It is noted that in formula (1), the subtraction is only performed on collected lines and is not performed on uncollected lines for $K_i^t$. For example, for $K_i^t$, if the odd-numbered lines is collected, the subtraction is only performed on the odd-numbered lines.

At step S206, fourth data $rK'_i{}^t$ for each imaging phase is obtained by subtracting central basic k-space data $K'_i{}^o$ from the third data $K'_i{}^t$ for each imaging phase; where the central basic k-space data $K'_i{}^o$ refers to the part of the second data located at the k-space central region.

At step S206, L*T sets of fourth data $rK'_i{}^t$ are obtained. The step S206 may be expressed by formula (2):

$$rK'_i{}^t = K'_i{}^t - K'_i{}^o \qquad (2).$$

At step S207, a sparse image $rI'^t$ for each imaging phase is obtained by performing image reconstruction on the fourth data $rK'_i{}^t$ for the imaging phase.

In an example, T number of sparse images $rI'^t$ are obtained by respectively performing image reconstruction on the L*T sets of fourth data $rK'_i{}^t$ via the SENSE Parallel Imaging manner.

For dynamic enhanced imaging, the difference between the MR image for each imaging phase is mainly concentrated on low-frequency information. The fourth data is located at the k-space central region. From the MRI encoding, data located at the k-space central region is mainly low-frequency component. Therefore, the sparse image obtained by step S207 reflects the difference between the MR image for each imaging phase more accurately.

At step S208, a differential image $rI^t$ for each of the imaging phases is reconstructed from the differential k-space data $rK_i^t$ for the imaging phase by regularizing the reconstruction according to positions of non-zero pixels in the sparse image for the imaging phase, i.e., taking positions of non-zero pixels in the sparse image for the imaging phase as the prior knowledge of the regularization such that the reconstructed image has the same positions of non-zero pixels as the sparse image.

At step S208, T number of differential images $rI^t$ are obtained.

At step S209, a basic image $I^o$ is obtained by performing image reconstruction on the basic k-space data $K_i^o$.

In an example, the basic image $I^o$ is obtained by performing image reconstruction on the L sets of basic k-space data $K_i^o$ via Parallel Imaging method, such as SENSE manner.

At step S210, an MR image $I^t$ for each of the imaging phases is obtained by adding the differential image $rI^t$ for each of the imaging phases and the basic image $I^o$.

The step S210 is expressed as formula (3):

$$I^t = rI^t + I^o \qquad (3).$$

In the dynamic MRI method as shown in FIG. 8, L sets of second data, L*T sets of first data and L*T sets of third data are collected. Since the sparse image for each of the imaging phases is obtained based on the third data and the second data, the scanning speed is relatively fast and the quality of the MR image for each of the imaging phases is relatively great.

As an extension of the dynamic MRI method as shown in FIG. 8, L sets of second data are not collected. When L sets of second data are not collected, the basic k-space data $K_i^o$ may be obtained based on the first data for each of the imaging phases. For example, the basic k-space data $K_i^o$ is an average of the first data for each of the imaging phases. The central basic k-space data $K'_i{}^o$ is an average of the third data for each of the imaging phases.

Figure 9:
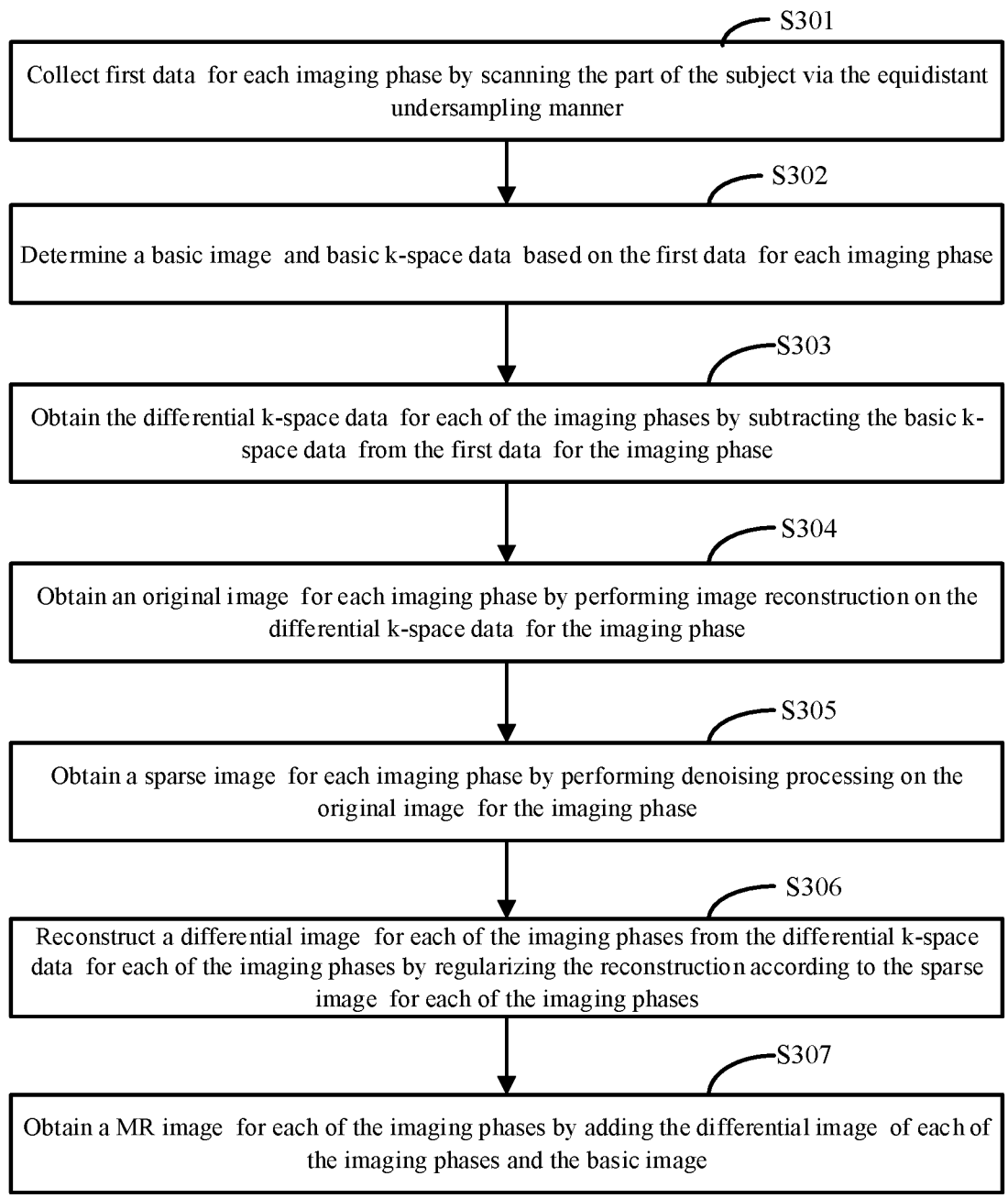
FIG. 9 is a schematic flowchart of a process of a dynamic MRI method according to one or more examples of the present disclosure.

To further shorten the scanning time, the present disclosure also provides a dynamic MRI method as shown in FIG. 9. FIG. 9 is a schematic flowchart of a process of a dynamic MRI method according to one or more examples of the present disclosure. The process of the method shown in FIG. 9 includes steps S301-S307.

At step S301, according to preset magnetic resonance scanning parameters, first data $K_i^t$ for each imaging phase is collected by scanning the part of the subject via the equi-distant undersampling manner.

At step S302, a basic image $I^o$ and basic k-space data $K_i^o$ are determined based on the first data $K_i^t$ for each imaging phase.

The implementation of the step S302 may refer to the examples of the step S102. It is noted that when the basic k-space data $K_i^o$ is determined, the basic image $I^o$ is obtained with the SENSE manner.

At step S303, the differential k-space data $rK_i^t$ for each of the imaging phases is obtained by subtracting the basic k-space data $K_i^o$ from the first data $K_i^t$ for the imaging phase.

The step S303 may be expressed by the above formula (1).

At step S304, an original image $rI'_o{}^t$ for each imaging phase is obtained by performing image reconstruction on the differential k-space data $rK_i^t$ for the imaging phase.

At step S305, a sparse image $rI'^t$ for each imaging phase is obtained by performing denoising processing on the original image $rI'_o{}^t$ for the imaging phase.

At step S306, a differential image $rI^t$ for each of the imaging phases is reconstructed from the differential k-space data for $rI_i^t$ each of the imaging phases by regularizing the reconstruction according to the sparse image $rI^t$ for each of the imaging phases.

The step S306 is the same as the above step S208, and will not be described in detail herein for the sake of brevity.

At step S307, an MR image $I^t$ for each of the imaging phases is obtained by adding the differential image $rI^t$ of each of the imaging phases and the basic image $I^o$.

The step S307 is expressed as the above formula (3).

In the dynamic MRI method as shown in FIG. 9, L*T sets of first data are collected. In this example, time for collecting data is relatively short.

The dynamic MRI methods provided by the above examples use sparsity in the image domain.

Figure 10:
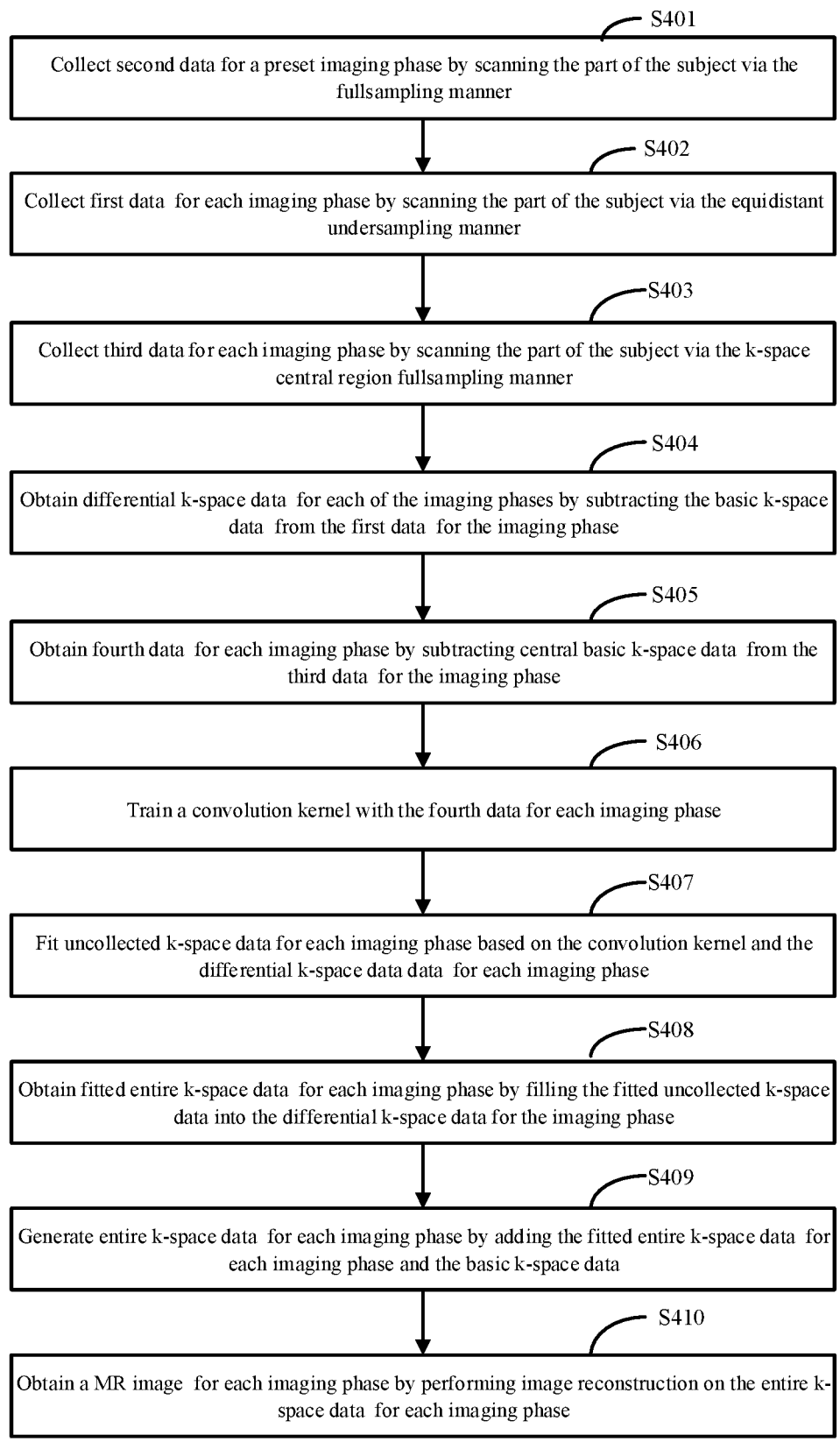
FIG. 10 is a schematic flowchart of a process of a dynamic MRI method according to one or more examples.

The present disclosure further provides a dynamic MRI method, which is shown in FIG. 10. FIG. 10 is a process of a schematic flowchart of a dynamic MRI method according to one or more examples. The dynamic MRI method shown in FIG. 10 improves k-t space GeneRalized Autocalibrating Partially Parallel Acquisitions (k-t GRAPPA) algorithm. The improved algorithm uses sparsity in the image domain and a convolution kernel of GRAPPA is relatively good. The process of the method shown in FIG. 10 includes steps S401-S410.

At step S401, according to preset magnetic resonance scanning parameters, second data for a preset imaging phase is collected by scanning the part of the subject via the fullsampling manner, where the second data for the preset imaging phase is taken as basic k-space data $K_l^o$.

At step S402, according to preset magnetic resonance scanning parameters, first data $K_l^t$ for each imaging phase is collected by scanning the part of the subject via the equidistant undersampling manner.

At step S403, according to preset magnetic resonance scanning parameters, third data $K'_l^t$ for each imaging phase is collected by scanning the part of the subject via the k-space central region fullsampling manner.

To increase the scanning speed, the equidistant undersampling manner is used to collect first data $K_l^t$ for each imaging phase.

To train a convolution kernel for each imaging phase as discussed below at step S406, third data $K'_l^t$ for each imaging phase is collected.

At step S404, differential k-space data $rK_l^t$ for each of the imaging phases is obtained by subtracting the basic k-space data $K_l^t$ from the first data $K_l^t$ for the imaging phase.

The step S404 may be expressed by the formula (1).

At step S405, fourth data $rK'_l^t$ for each imaging phase is obtained by subtracting central basic k-space data $K'_l^t$ from the third data $K'_l^t$ for the imaging phase; where the central basic k-space data $K'_l^t$ refers to the part of the second data located at the k-space central region.

The step S405 may be expressed by the above formula (2).

When a reconstructed image corresponding to the fourth data is sparse, since the k-t GRAPPA algorithm automatically utilizes the sparse feature, a result obtained by the fourth data is better than a result obtained by non-sparse data.

At step S406, a convolution kernel is trained with the fourth data for all of the imaging phases.

At step S407, uncollected k-space data for each imaging phase is fitted based on the convolution kernel and the differential k-space data $rK_l^t$ for the imaging phase. Specifically, the uncollected k-space data for an imaging phase is fitted based on the corresponding convolution kernel, the differential k-space data for each of the channels at the imaging phase, and the differential k-space data for the associated imaging phases. It is assumed that the imaging phase is expressed by t, A represents the acceleration factor and is an integer greater than or equal to 2, and m is an integer from 1 to A. At this case, the associated imaging phases are expressed by (t−m) and (t+A−m).

At step S408, fitted entire k-space data $frK'_l^t$ for each imaging phase is obtained by filling the fitted uncollected k-space data into the differential k-space data $rK_l^t$ for the imaging phase.

At step S409, entire k-space data $fK_l^t$ for each imaging phase is generated by adding the fitted entire k-space data $frK'_l^t$ for each imaging phase and the basic k-space data $K_l^o$.

The step S409 may be expressed by formula (4):

$$fK_l^t = frK'_l^t + K_l^o \qquad (4).$$

At step S410, an MR image $I^t$ for each imaging phase is obtained by performing image reconstruction on the entire k-space data $fK_l^t$ for each imaging phase.

At steps S401-S410, when reconstructing the MR image for one imaging phase, it uses the collected data and the fitted uncollected data for the imaging phase. The method shown in FIG. 10 uses the correlation between images of the plurality of imaging phases, provides more information for fitting the uncollected data and improves the accuracy of fitting. Therefore, the method shown in FIG. 10 can improve the quality of the MR image for each imaging phase, and at the same time, shorten MR scanning time.

Examples of step S406 is described in detail below.

The step S406 is implemented based on the GRAPPA algorithm. In an example, the convolution kernel is trained with the fourth data for each imaging phase through the following formula (5):

$$S_j^t(k_y - m\Delta k_y) = \sum_{l=1}^{L} \left( \sum_{b_1=0}^{N_{b_1}-1} n_{b_1}(j,t,l,m) S_l^t(k_y - b_1 A \Delta k_y) + \sum_{v=t-m,t+A-m} \sum_{b_2=0}^{N_{b_2}-1} n_{b_2}^v(j,t,l,m) S_l^v(k_y - m\Delta k_y - b_2 A \Delta k_y) \right) \qquad (5)$$

In formula (5), $k_y$ represents a line;

$\Delta k_y$ represents a distance between two adjacent lines in a k-space, and $\Delta k_y = 1$;

A represents an acceleration factor, and $m \in \{1, 2, \ldots, A\}$;

$S_j^t(k_y - m \cdot \Delta k_y)$ represents data of a $(k_y - m \cdot \Delta k_y)$-th line in a j-th channel for imaging phase t;

$S_l^t(k_y - b_1 A \Delta k_y)$ represents data of a $(k_y - b_1 A \Delta k_y)$-th line in a l-th channel for imaging phase t;

$S_l^v(k_y - m\Delta k_y - b_2 A \Delta k_y)$ represents data of a $(k_y - m\Delta k_y - b_2 A \Delta k_y)$-th line in the l-th channel for imaging phase v;

L represents a number of channels and is an integer greater than or equal to 2;

$N_{b_1}$ represents a number of blocks in a convolution kernel at imaging phase t, where a block is defined as a combination of a single collected line and (A-1) missing lines within imaging phase t;

$N_{b_2}$ represents a number of blocks in a convolution kernel at imaging phase v, where a block is defined as a combination of a single collected line and (A-1) missing lines within imaging phase t;

$n_{b_1}(j, t, l, m)$ represents a weight corresponding to the data of the $(k_y - b_1 A \Delta k_y)$-th in the l-th channel for block bi in the convolution kernel at imaging phase t;

$n_{b_2}^v(j, t, l, m)$ represents a weight corresponding to the data of the $(k_y - m\Delta k_y - b_2 A \Delta k_y)$-th line in the l-th channel for block $b_2$ in the convolution kernel at imaging phase v;

l represents a channel index;

j represents a channel index;

$b_1$ represents an index of each block in the convolution kernel at imaging phase t;

b2 represents an index of each block in the convolution kernel at imaging phase v;

v represents an imaging phase index.

When values of j, t and m are not changed, the weight $n_{b_1}(j, t, l, m)$ corresponds to a set in a case that l is from 1 to L and $b_1$ is from 1 to $Nb_1$, the weight $n_{b_2}^v(j, t, l, m)$ corresponds to a set in a case that l is from 1 to L, $b_2$ is from 1 to $Nb_2$, and v is (t−m) and (t+A−m). For the formula (5), the convolution kernel of the $(k_y - m \cdot \Delta k_y)$-th line in the j-th channel for the imaging phase t is associated with the above two sets.

The following describes the training process in detail.

First, a plurality of equations including unknown parameters $n_{b_1}(j,t,l,m)$ and $n_{b_2}^v(j,t,l,m)$ are obtained based on the L*T sets of fourth data $rK_t^t$ and the above formula (5). Then, the parameters $n_{b_1}$ (j, t, l, m) and $n_{b_2}^v$ (j, t, l, m) are determined based on the plurality of equations.

In an example, $S_j^t(k_y-m\cdot\Delta k_y)$, $S_l^t$ $(k_y-b_1 A \Delta k_y)$ and $S_l^v$ $(k_y-m\Delta k_y-b_2 A\Delta k_y)$ in formula (5) uses the fourth data $rK'_l^t$ instead of third data $K'_l^t$. The reason is that an image corresponding to the fourth data is sparse, the GRAPPA algorithm automatically utilizes the sparse feature, the convolution kernel trained by the fourth data is better than the convolution kernel trained by the third data.

In an example, the collected fourth data $S_j^t(k_y-m\cdot\Delta k_y)$, $S_l^t(k_y-b_1 A\Delta k_y)$ and $S_l^v(k_y-m\Delta k_y-b_2 A\Delta k_y)$ are substituted into the formula (5) in a way that a plurality of equations are obtained. In the plurality of equations, unknown parameters $n_{b_1}$(j, t, l, m) and $n_{b_2}^v$ (j, t, l, m) are to be determined. The number of lines in the k-space central region is set such that the number of the equations is greater than or equal to the number of the unknown parameters. In this way, the unknown parameters are determined. The convolution kernel of the $(k_y-m\cdot\Delta k_y)$-th line in the j-th channel for the imaging phase t includes $n_{b_1}$(j, t, l, m) and $n_{b_2}^v$(j, t, l, m).

Based on the above formula (5), the convolution kernel of the respective lines in each channel for each imaging phase can be obtained. From the k-t GRAPPA algorithm, the convolution kernel may be used to fit data of uncollected lines.

The detailed description of step S407 is described below.

At step S406, the convolution kernel of the respective lines in each channel for each imaging phase is obtained. Based on the formula (5), by substituting the differential k-space data into the right of the formula (5), the uncollected k-space data can be calculated.

That is, at step S407, the items in the right of the equality sign of the formula (5) are known and the item in the left of the equality sign of the formula (5) is unknown. The uncollected k-space data can be calculated based on the known items in the right of the equality sign of the formula (5).

The fitted entire k-space data $frK'_l^t$ for each channel for each imaging phase is obtained by filling the fitted uncollected k-space data for each channel for each imaging phase into the differential k-space data $rK_l^t$.

In some cases, the fitted entire k-space data $frK'_l^t$ i for each channel for each imaging phase are equivalent to k-space data obtained by the fullsampling manner.

It is noted that when the undersampling manner is the equidistant undersampling manner, the above process of training the convolution kernel is not iteration.

In an example, the undersampling manner includes a non-equidistant undersampling manner. When MR signal data is collected via the non-equidistant undersampling manner, the convolution kernel of the respective lines in each channel for each imaging phase is respectively trained with the fourth data via iterative convolution. That is, in this case, the process of training the convolution kernel is an iterative process. The process of training the convolution kernel via iterative convolution is similar with the process of training the convolution kernel in which the equidistant undersampling manner is used. The difference is: when training the convolution kernel via iterative convolution, each convolution kernel needs to be trained repeatedly until an expectation is satisfied.

In addition, the process of training the convolution kernel may use any collected fourth data, or data obtained by the previous iteration. For each channel for each imaging phase, shape and size of each convolution kernel may be different.

In the dynamic MRI method as shown in FIG. 10, the process of filling data is implemented at the frequency domain.

Based on the dynamic MRI methods provided by the present disclosure, the present disclosure further provides a dynamic MRI device.

Figure 11:
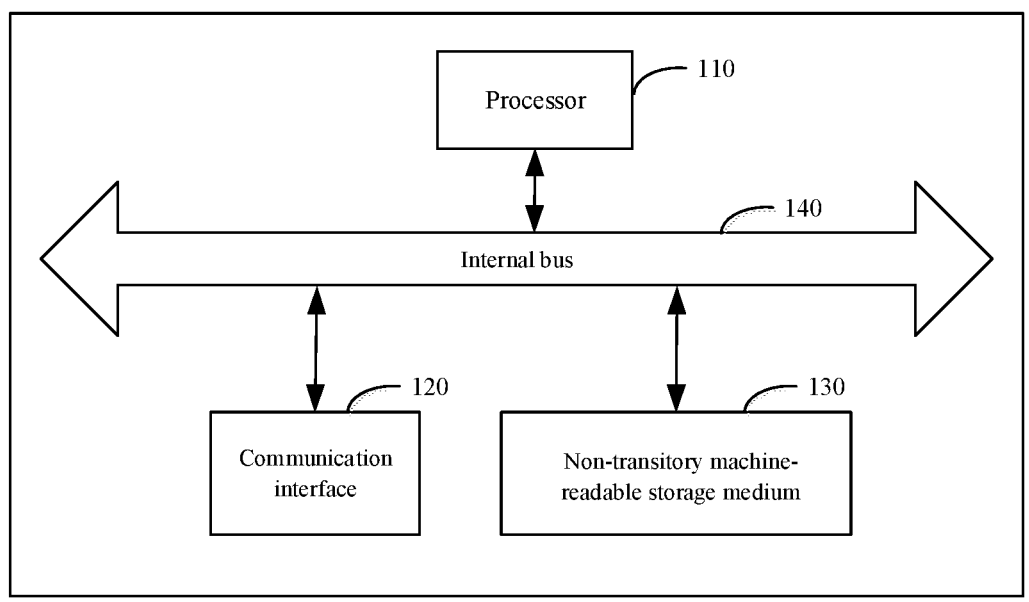
FIG. 11 is a schematic diagram of an example hardware structure of a dynamic MRI device.

FIG. 11 is a schematic diagram of an example hardware structure of a dynamic MRI device. The device includes a processor 110, a communication interface 120, a non-transitory machine readable storage medium 130 and an internal bus 140. The processor 110, the communication interface 120 and the non-transitory machine readable storage medium 130 are typically connected to each other by the internal bus 140.

The processor 110 may read the machine executable instructions stored in the non-transitory machine readable storage medium 130 to perform the method of reconstructing magnetic resonance images for contrasts described above.

It is noted that the dynamic MRI device corresponds to the dynamic MRI method. The device can reach a same technical effect as the method, and further detail is omitted for brevity.

For simplicity and illustrative purposes, the present disclosure is described by referring mainly to examples thereof. In the above descriptions, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure. As used herein, the terms "a" and "an" are intended to denote at least one of a particular element, the term "includes" means includes but not limited to, the term "including" means including but not limited to, and the term "based on" means based at least in part on.

The above description is merely preferred examples of the present disclosure and is not intended to limit the present disclosure in any form. Although the present disclosure is disclosed by the above examples, the examples are not intended to limit the present disclosure. Those skilled in the art, without departing from the scope of the technical scheme of the present disclosure, may make a plurality of changes and modifications of the technical scheme of the present disclosure by the method and technical content disclosed above.

Therefore, without departing from the scope of the technical scheme of the present disclosure, based on technical essences of the present disclosure, any simple alterations, equal changes and modifications should fall within the protection scope of the technical scheme of the present disclosure. Accordingly, other embodiments are within the scope of the following claims.

What is claimed is:

1. A dynamic magnetic resonance imaging method, comprising:
   collecting respective k-space data for each of a plurality of imaging phases by scanning a part of a subject via an equidistant undersampling manner, wherein, the part of the subject changes dynamically at the plurality of imaging phases;
   determining basic k-space data for the part of the subject;
   determining respective differential k-space data for each of the imaging phases based on the respective k-space data for the imaging phase and the basic k-space data;

obtaining a basic image by performing image reconstruction on the basic k-space data;

determining a respective sparse image for each of the imaging phases;

reconstructing a respective differential image for each of the imaging phases from the respective differential k-space data for the imaging phase, wherein, the reconstruction is regularized according to the respective sparse image for the imaging phase such that the reconstructed respective differential image has same positions of non-zero pixels as the respective sparse image; and obtaining a magnetic resonance image for each of the imaging phases based on the respective differential image for the imaging phase and the basic image.

2. The method of claim 1, wherein determining the basic k-space data comprises:

collecting particular k-space data for a preset imaging phase by scanning the part of the subject via a fullsampling manner; and taking the particular k-space data for the preset imaging phase as the basic k-space data.

3. The method of claim 2, wherein the preset imaging phase comprises one of a first imaging phase before a contrast agent is injected, and a last imaging phase after the contrast agent has been fully washed out.

4. The method of claim 1, wherein, when scanning via the equidistant undersampling manner, for at least two of the plurality of imaging phases, k-space positions of collected phase encoding lines are not exactly same.

5. The method of claim 1, wherein determining the basic k-space data comprises:

determining an average of the respective k-space data for the plurality of imaging phases; and taking the average as the basic k-space data.

6. The method of claim 1, wherein determining the basic k-space data comprises:

reconstructing a combined image from the respective k-space data for the plurality of imaging phases by taking the respective k-space data for the plurality of imaging phases as k-space data for one same imaging phase; and performing an inverse Fourier transform on the combined image to determine the basic k-space data.

7. The method of claim 1, wherein determining the basic k-space data comprises:

reconstructing a first image for each of the imaging phases from the respective k-space data for the imaging phase;

generating an average image by averaging the first images for the plurality of imaging phases; and performing an inverse Fourier transform on the average image to determine the basic k-space data.

8. The method of claim 1, wherein determining the basic k-space data comprises:

forming virtual entire k-space data by combining the respective k-space data for each of the imaging phases in accordance with a k-space positional relationship of phase encoding lines for each of the imaging phases; and determining the basic k-space data by performing averaging processing on the virtual entire k-space data.

9. The method of claim 1, wherein determining the respective differential k-space data for the imaging phase based on the respective k-space data for the imaging phase and the basic k-space data comprises:

determining the respective differential k-space data for the imaging phase by subtracting the basic k-space data from the respective k-space data for the imaging phase.

10. The method of claim 1, wherein determining the respective sparse image for each of the imaging phases comprises:

collecting respective central k-space data for each of the imaging phases by scanning the part of the subject via a k-space central region fullsampling manner;

obtaining respective central differential k-space data for each of the imaging phases by subtracting central basic k-space data from the respective central k-space data for the imaging phase, wherein the central basic k-space data refers to one of the following:

an average of the respective central k-space data for each of the imaging phases, and a part of the basic k-space data located at the k-space central region; and obtaining the respective sparse image for each of the imaging phases by performing image reconstruction on the respective central differential k-space data for the imaging phase.

11. The method of claim 1, wherein determining the respective sparse image for each of the imaging phases comprises:

generating a respective original image for each of the imaging phases by performing image reconstruction on the respective differential k-space data for the imaging phase; and determining the respective sparse image for each of the imaging phases by performing denoising processing on the respective original image for the imaging phase.

12. A dynamic magnetic resonance imaging device, comprising:

at least one processor; and at least one non-transitory machine-readable storage medium coupled to the at least one processor having machine-executable instructions stored thereon that, when executed by the at least one processor, cause the at least one processor to perform operations comprising:

collecting respective k-space data for each of a plurality of imaging phases by scanning a part of a subject via an equidistant undersampling manner, wherein, the part of the subject changes dynamically at the plurality of imaging phases;

determining basic k-space data for the part of the subject;

determining respective differential k-space data for each of the imaging phases based on the respective k-space data for the imaging phase and the basic k-space data;

obtaining a basic image by performing image reconstruction on the basic k-space data;

determining a respective sparse image for each of the imaging phases;

reconstructing a respective differential image for each of the imaging phases from the respective differential k-space data for the imaging phase, wherein, the reconstruction is regularized according to the respective sparse image for the imaging phase such that the reconstructed respective differential image has same positions of non-zero pixels as the respective sparse image; and obtaining a respective magnetic resonance image for each of the imaging phases based on the respective differential image for the imaging phase and the basic image.

13. The device of claim 12, wherein determining the basic k-space data comprises:

collecting particular k-space data for a preset imaging phase by scanning the part of the subject via a full-sampling manner; and taking the particular k-space data for the preset imaging phase as the basic k-space data.

14. The device of claim 13, wherein the preset imaging phase comprises one of a first imaging phase before a contrast agent is injected and a last imaging phase after the contrast agent has been fully washed out.

15. The device of claim 12, wherein, when scanning via the equidistant undersampling manner, for at least two of the plurality of imaging phases, k-space positions of collected phase encoding lines are not exactly same.

16. The device of claim 12, wherein determining the basic k-space data comprises:

determining an average of the respective k-space data for the plurality of imaging phases; and taking the average as the basic k-space data.

17. The device of claim 12, wherein determining the basic k-space data comprises:

reconstructing a combined image from the respective k-space data for the plurality of imaging phases by taking the respective k-space data for the plurality of imaging phases as k-space data for one same imaging phase; and performing an inverse Fourier transform on the combined image to determine the basic k-space data.

18. The device of claim 12, wherein determining the respective sparse image for each of the imaging phases comprises:

collecting respective central k-space data for each of the imaging phases by scanning the part of the subject via a k-space central region fullsampling manner;

obtaining respective central differential k-space data for each of the imaging phases by subtracting central basic k-space data from the respective central k-space data for the imaging phase, wherein the central basic k-space data refers to one of the following:

an average of the respecitive central k-space data for the imaging phases, and a part of the basic k-space data located at the k-space central region; and obtaining the respective sparse image for each of the imaging phases by performing image reconstruction on the respective central differential k-space data for the imaging phase.

19. The device of claim 12, wherein determining the respective sparse image for each of the imaging phases comprises:

generating a respective original image for each of the imaging phases by performing image reconstruction on the respective differential k-space data for the imaging phase; and determining the respective sparse image for each of the imaging phases by performing denoising processing on the respective original image for the imaging phase.

\* \* \* \* \*